United States Patent [19]

Hasegawa

[11] Patent Number: 4,631,214
[45] Date of Patent: Dec. 23, 1986

[54] TRANSPARENT ELECTROMAGNETIC WAVE SHIELDING MATERIAL

[75] Inventor: Hiroaki Hasegawa, Fukui, Japan

[73] Assignee: Fukuvi Chemical Industry Co., Ltd., Fukui, Japan

[21] Appl. No.: 812,573

[22] Filed: Dec. 23, 1985

[30] Foreign Application Priority Data

Dec. 24, 1984 [JP] Japan .................................. 270728
Mar. 29, 1985 [JP] Japan .................................. 44832
Mar. 29, 1985 [JP] Japan .................................. 63923

[51] Int. Cl.⁴ .......................... H05K 9/00; B32B 3/30; B32B 15/08; B32B 27/12
[52] U.S. Cl. .................. 428/68; 174/35 MS; 219/10.55 D; 264/342 R; 264/348; 315/85; 428/74; 428/76; 428/161; 428/164; 428/172; 428/251; 428/252; 428/255; 428/256
[58] Field of Search .............. 174/35 MS; 264/342 R, 264/348; 428/68, 74, 76, 161, 164, 172, 251, 252, 255, 256

[56] References Cited

U.S. PATENT DOCUMENTS

| | | | |
|---|---|---|---|
| 2,416,202 | 2/1947 | Nauman | 174/35 MS |
| 2,958,754 | 11/1960 | Hahn | 174/35 MS |
| 3,030,435 | 4/1962 | Andrews | 174/35 MS |
| 3,305,623 | 2/1967 | Bakker et al. | 174/35 MS |
| 4,215,258 | 7/1980 | Nelson et al. | 174/35 MS |
| 4,247,737 | 1/1981 | Johnson et al. | 174/35 MS |
| 4,412,255 | 10/1983 | Kuhlman et al. | 174/35 MS |
| 4,435,465 | 3/1984 | Ebneth et al. | 174/35 MS |
| 4,471,015 | 9/1984 | Ebneth et al. | 174/35 MS |

Primary Examiner—James C. Cannon
Attorney, Agent, or Firm—Sughrue, Mion, Zinn, Macpeak and Seas

[57] ABSTRACT

Disclosed is a transparent electromagnetic wave shielding material comprising a black electroconductive synthetic fiber gauze embedded in a molded synthetic resin body composed of diethylene glycol bisallyl carbonate. This gauze is preferentially located in the vicinity of the surface of the molded body, and the resin surface sinks in the portions of mesh openings of the gauze to impart a light scattering property to the surface.

11 Claims, 9 Drawing Figures

TRANSPARENT ELECTROMAGNETIC WAVE SHIELDING MATERIAL

BACKGROUND OF THE INVENTION (1) Field of the Invention

The present invention relates to an electromagnetic wave shielding material which can be seen-through and has an electromagnetic wave shielding effect, and in which deformation such as warping or bending or generation of the internal strain is controlled and various resistance characteristics are excellent. More particularly, the present invention relates to an electromagnetic wave shielding material in which a light scattering property is given to the surface and which is excellent in the easy-to-see characteristic of an image on a Braun tube.

(2) Description of the Prior Art

With recent development of OA devices and other electronic devices, an electromagnetic wave shielding plate which has an electromagnetic wave shielding effect and can be seen through is desired for a CRT filter of an OA device or a peeping window of a shield chamber of an electronic device so as to prevent generation of a noise or prevent dilect influences of electromagnetic waves on the human body.

As the conventional electromagnetic shielding plate that can be seen through, there can be mentioned (1) a porous metal plate such as a punched metal plate, (2) an article formed by coating a transparent material with an electroconductive metal oxide or metal by vacuum evaporation deposition or the like, (3) an electroconductive synthetic fiber net and (4) a net of a metal such as stainless steel. The plate (1) is defective in that the shielding effect is reduced with the lapse of time by corrosion or the like, and the plate (2) is defective in that a sufficient shielding effect can hardly be obtained. The net (3) can be formed relatively easily, but the net is readily broken or corroded and cleaning for removing adherent dusts is difficult. The net (4) is defective in that a product comprising filaments having a fine diameter can hardly be obtained.

As another known electromagnetic wave shielding plate, there can be mentioned a product formed by interposing an electroconductive net between two transparent resin plates and integrating the assembly. However, the sharpness of the seen-through image is reduced by reflection of light rays on the surface of the transparent resin plate, and a reflected image is an eyesore. This defect is made more conspicuous by reduction of the transmittance of the transmitted light.

SUMMARY OF THE INVENTION

Under this background we made research, and it was found that if a resin composed mainly of diethylene bisallyl carbonate is selected among various resins and a metal-coated synthetic fiber gauze is selected among various porous electroconductive materials and if the metal-coated fiber gauze is embedded in a molded body of the above-mentioned resin, there can be obtained an electromagnetic wave shielding material in which the transparency is high, deformation such as warping or bending is prevented, and various resistance characteristics are excellent.

It is therefore a primary object of the present invention to provide an electromagnetic wave shielding material in which the above-mentioned defects of the conventional electromagnetic wave shielding materials are eliminated.

Another object of the present invention is to provide a see-through electromagnetic wave shielding material which is excellent in the transparency and the electromagnetic wave shielding property, and in which deformation is prevented at the molding step and various resistance characteristics such as heat resistance, chemical resistance, abrasion resistance, stain resistance and are resistance are excellent.

Still another object of the present invention is to provide a transparent electromagnetic wave shielding material of the resin/electroconductive net type in which deformation such as warping or bending caused when a diethylene glycol bisallyl carbonate resin is used, or cracking generated by the internal strain, is effectively prevented.

Still another object of the present invention is to provide a see-through electromagnetic wave shielding plate having a light reflection-preventing effect.

A further object of the present invention is to provide a see-through electromagnetic wave shielding plate in which the light reflection-preventing effect can be easily obtained by one-sided arrangement of an electroconductive net and by shrinkage of a synthetic resin at the polymerizing and molding step.

In accordance with one fundamental aspect of the present invention, there is provided a transparent electromagnetic wave shielding material comprising a molded body of a synthetic resin composed mainly of diethylene glycol bisallyl carbonate and a blackened electroconductive synthetic fiber gauze embedded in the molded body.

In accordance with another aspect of the present invention, there is provided a shielding material as described above, wherein the electroconductive synthetic fiber gauze is embedded so that the gauze is predominantly arranged in the vicinity of the surface of the molded body and dents are formed on the resin surface in the mesh portions of the electroconductive synthetic fiber gauze to impart a light scattering property to the surface of the molded body.

DETAILED DESCRIPTION OF THE PREFERRED EMBODIMENTS

Diethylene glycol bisallyl carbonate units may be present in an amount of 60 to 100% by weight of the total synthetic resin units, and an electroconductive synthetic resin fiber gauze having a mesh size of 80 to 250 mesh is advantageously used.

Figure 1:
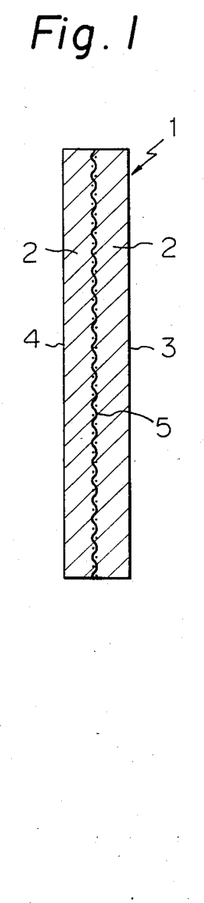
FIG. 1 is a sectional view of a transparent electromagnetic wave shielding material according to the present invention.

Referring to FIG. 1 illustrating the sectional structure of the electromagnetic wave shielding material of the present invention, this shielding plate 1 is integrally formed of a diethylene glycol bisallyl carbonate resin 2, and a metal-deposited synthetic fiber gauze 5 is embedded one surface 3 and the other surface 4. The two resin portions defined by the metal-deposited synthetic fiber gauze are connected and integrated through openings of the gauze 5.

Figure 2:
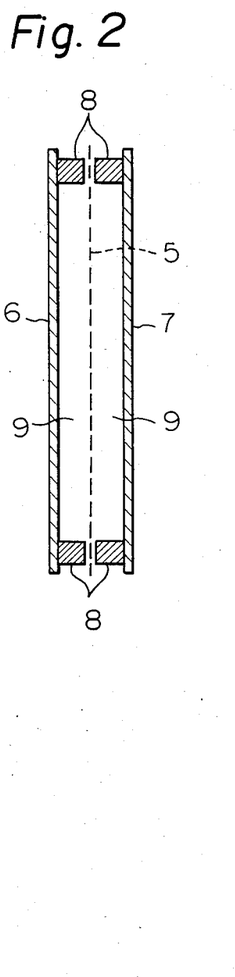
FIG. 2 is a diagram illustrating the production of an electromagnetic wave shielding material according to the present invention.

As shown in FIG. 2, the electromagnetic wave shielding material 1 of the present invention is obtained by fixing liquid-tightly the metal-deposited synthetic fiber gauze 5 in the central portion of sheet-like molds 6 and 7 formed of a reinforced glass or the like through spacers or gaskets 8 which can follow the shrinkage at the polymerizing and curing step, and casting a composition comprising diethylene glycol bisallyl carbonate and a radical polymerization initiator in the space 9 and polymerizing and curing the composition under heating.

Diethylene glycol bisallyl carbonate used in the present invention having a chemical structure represented by the following formula:

This monomer has two allyl groups polymerizable by a radical initiator, and the monomer is characterized in that the monomer forms a thermosetting polycarbonate having a three-dimensional net-like structure by polymerization and curing. Because of this characteristic, the molded body of the present invention is advantageous in that it is substantially colorless and transparent, and the molded body is essentially excellent in various resistance characteristics such as heat resistance, chemical resistance, abrasion resistance, stain resistance, weatherability and arc resistance.

Diethylene glycol bisallyl carbonate alone is preferably used as the monomer component, but other monofunctional, ethylenically unsaturated monomer, such as a methacrylic acid ester, an acrylic acid ester or styrene may be used as a comonomer so far as the essential properties of the resin are not lost.

As the radial initiator, there may be used peroxides such as t-butylhydroperoxide, cumene hydroperoxide, di-t-butyl peroxide, t-butyl peroxybenzoate, lauroyl peroxide, diisopropyl peroxydicarbonate and methylethyl ketone peroxide, and azo compounds such as azobisisobutyronitrile and azobismethylisovaleronitrile. It is preferred that the radical initiator be used in an amount of 0.1 to 5% by weight, especially 1 to 4% by weight, based on the monomer. The radical initiator may be used in combination with a promoter such as an amine or metal soap.

Polymerization and curing can be initiated also by heat or actinic rays.

Known additives such as a colorant, an antioxidant, a surface active agent, a parting agent and an ultraviolet absorber may be incorporated into the polymerizable curable composition used in the present invention without departing from the spirit of the present invention.

In accordance with one embodiment of the present invention, an ultraviolet absorber is incorporated into the polymerizable composition. As the ultraviolet absorber, any of known ultraviolet absorbers may be used, but since a polyol polyallyl carbonate cured molded article absorbs or reflects ultraviolet rays having a wavelength shorter than 270 nm (nonameters), a substance capable of absorbing ultraviolet rays having a longer wavelength, that is, a wavelength of 270 to 400 nm, especially a benzophenone or benzotriazole type ultraviolet absorber, is preferably used.

The benzophenone or benzotriazole type ultraviolet absorber is defective in that the solubility or compatibility to a monomer such as diethylene glycol bisallyl carbonate is poor. In accordance with one preferred embodiment of the present invention, an ethylenically unsaturated monomer having a dissolving power to the ultraviolet absorber and a compatibility with diethylene glycol bisallyl carbonate is used as the comonomer, whereby there can be attained effects of improving the dispersibility of the ultraviolet absorber in the base and obtaining a high shielding effect while maintaining and transparency. It has been found that methacrylic acid esters such as methyl methacrylate, ethyl methacrylate, n-butyl methacrylate, benzyl methacrylate and glycidyl methacrylate and acrylic acid esters such as methyl acrylate, ethyl acrylate and n-butyl acrylate are effective as such as comonomer.

The comonomer is used in an amount sufficient to dissolve or disperse the ultraviolet absorber and generally in an amount of at least 5% by weight based on the allyl carbonate monomer but up to 30% by weight based on the allyl carbonate monomer. It is preferred that the comonomer be used in an amount of up to 15% by weight, especially up to 10% by weight, based on the allyl carbonate monomer. If the comonomer is used in an amount exceeding the above range, bad influences are imposed on the chemical resistance and other resistance characteristics. Accordingly, it is preferred that the comonomer be used in a minimum amount necessary for dissolving and mingling the ultraviolet absorber in and with the base.

As preferred examples of the benzophenone or benzotriazole type ultraviolet absorber, there can be mentioned 2,2'-dihydroxy-4-methoxybenzophenone, 2,2'-dihydroxy-4,4'-dimethoxybenzophenone, 2,2',4,4'-tetrahydroxybenzophenone, 2(2'-hydroxy-5'-methylphenyl)benzotriazole, 2(2'-hydroxy-3'-t-butyl-5'-methylphenyl)-5-chlorobenzotriazole, 2(2'-hydroxy-4'-octoxyphenyl)benzotriazole and 2(2'-hydroxy-3',5'-di-t-butyl)benzotriazole, though ultraviolet absorbers that can be used in the present invention are not limited to those mentioned above.

It is preferred that the ultraviolet absorber be added in an amount of 0.005 to 0.5% by weight, especially 0.05 to 0.5% by weight, based on the base.

In the production of the molded body, the ultraviolet absorber is dissolved in an acrylic or methacrylic comonomer and the solution is mixed with the allyl carbonate monomer and radical initiator to form a molding composition.

In the present invention, an electroconductive synthetic fiber gauze is used in combination with the above-mentioned resin. The electroconductive synthetic fiber gauze is formed by preparing a gauze fabric having a coarse weave texture by weaving or knitting using a monofilament or multifilament yarn or spun yarn of a polyester, nylon, vinylon or acrylic fiber and coating the fabric with a metal such as copper, nickel, cobalt, chromium, silver or aluminum by plating or the like. The coating layer may be formed by nonelectrode plating (chemical plating), vacuum evaporation deposition or a combination thereof with electric plating. Formation fo the coating layer is performed to such an extent that the coated surface is electroconductive but clogging of openings is not caused. The coating layer may be composed of a single metal or a plurality of metals. For example, a combination of a nonelectrode plating layer and an electrode plating layer may be used. In view of the electromagnetic wave shielding property and light transmittance, it is preferred that the metal-coated synthetic fiber gauze should have a mesh size of 80 to 250 mesh, especially 100 to 200 mesh, and that the opening ratio be 10 to 90%, especially 30 to 80%. In order to remove the color of the metal and prevent the reflection, it is preferred that the electroconductive synthetic fiber gauze should have a black surface layer. Blackening can be accomplished by coating or plating the surface of the electroconductive layer with a black resin lacquer or black chromium or black nickel, or further matting the surface of the plating layer.

According to the present invention, great advantages can be attained with respect to the shrinkage of the resin at the molding step by using the electroconductive synthetic fiber gauze as the electroconductive net. More specifically, although a molding shrinkage factor of diethylene glycol bisallyl carbonate is about 14%, if a metal net or punched metal is used, shrinkage of the resin is hardly caused at the portion where the electroconductive net is formed but at the other portion, the resin is shrunk and therefore, an internal strain or stress is generated. At the part of the electroconductive net which is separate from the center of the molded resin body, deformation such as warping or bending is readily caused. Furthermore, while the shielding material is used or when heat is applied to the shielding material, cracks are formed and the transparency is degraded. In contrast, according to the present invention, even when a molded body having a relatively large size is formed, since the synthetic fiber as the base of the electroconductive net has flexibility and easy deformability, it can follow the shrinkage very well at the resin-curing step, and deformation such as warping or bending or generation of an internal stress or strain resulting in cracking can be effectively prevented.

Furthermore, in case of a synthetic fiber, a monofilament having a small diameter can be easily obtained, and therefore, the diameter of a strand of the electroconductive net can be made very small. Accordingly, when the shielding material of the present invention is used for an OA device or CRT filter, a transparent product giving no sense of disorder (eyesore) can be provided. Furthermore, the metal-coated synthetic fiber gauze per se is excellent in the processability such as the cutting property and the processability of a molded body having this gauze embedded therein is good. Moreover, when this molded body is subjected to bending processing, it shows a good property of following the bending.

In the electromagnetic wave shielding material of the present invention, since the electroconductive synthetic fiber gauze has a good property of following the shrinkage, the position of the embedment of the gauze is not particularly limited. For example, the gauze may be located in the central portion of the molded body or may be preferentially located on the surface side. If desired, at least two electroconductive synthetic fiber gauzes may be arranged in the molded body. In order to increase the adhesion of the gauze to the resin, the surface of the electroconductive synthetic resin gauze may be pre-treated with a silane coupling agent such as triethoxyaminopropylsilane. Furthermore, the surface of the gauze may be blackened to remove the color of the metal.

The polymerization and curing may be carried out at a temperature of 40° to 150° C. for 0.5 to 24 hours in one stage of a plurality of stages.

The electromagnetic wave shielding material is excellent in the electromagnetic wave shielding performance and it has a good see-through property. Furthermore, since the shielding material is prepared by the cell casting method, the electroconductive gauze is completely integrated with the molded body, and there is not a fear of peeling or distortion of a fine void image, which is often caused in a product formed by welding or bonding with an adhesive. Moreover, since a diethylene glycol bisallyl carbonate resin is used as the molding resin, the scratch resistance is much higher than those of other transparent resins such as an acrylic resin, and because of excellent chemical resistance, heat resistance and arc resistance, it is expected that the shielding material of the present invention will be used under special severe conditions. Moreover, by utilizing the characteristics of the resin, an ultraviolet ray shielding property can be easily imparted in addition to the electromagnetic wave shielding property.

Since a plate is formed by embedding the electroconductive synthetic fiber gauze in a diethylene glycol bisallyl carbonate resin which is excellent in various resistance characteristics, the problem of corrosion or breakage of the net can be solved, and cleaning can be performed very easily. The shielding material is uniform as a whole and when it is used for a CRT filter of an OA device, no sense of disorder or incompatibility is brought about.

Figures 4, 5, 6:
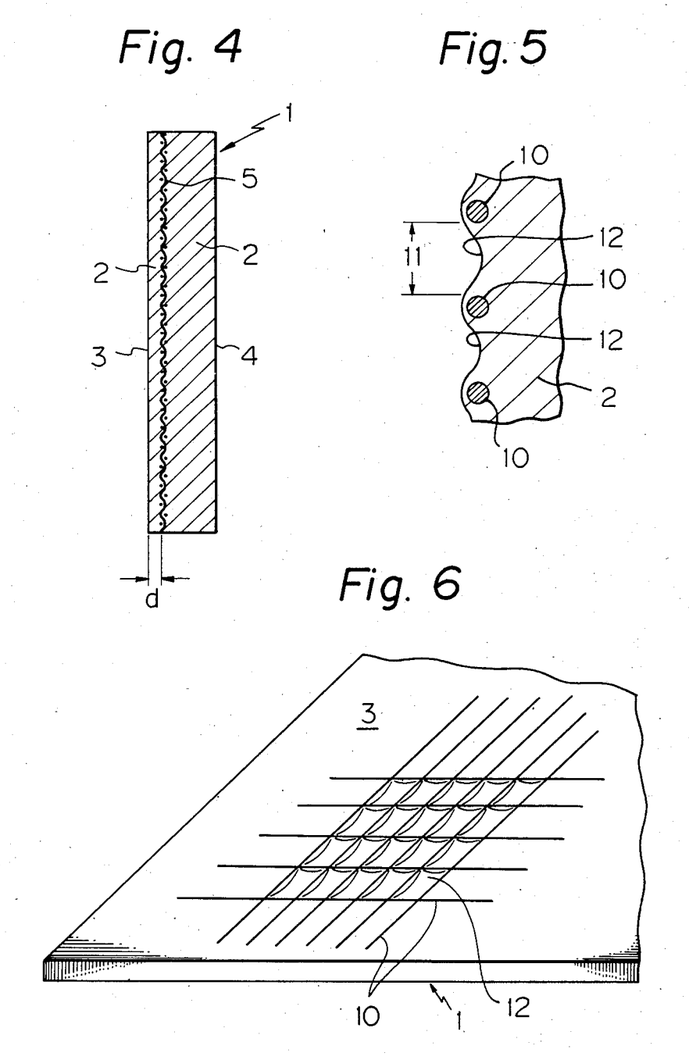
FIG. 4 is a sectional view showing a preferred embodiment of a see-through electromagnetic wave shielding plate according to the present invention.
FIG. 5 is an enlarged sectional view showing the surface of the electromagnetic wave shielding plate shown in FIG. 4.
FIG. 6 is an enlarged perspective view showing the surface of the plate shown in FIG. 4.

Referring to FIG. 4 illustrating the sectional structure of a most preferred embodiment of the present invention, this shielding plate 1 is integrally formed of a transparent resin 2 and has one surface 3 and the other surface 4. In the embodiment illustrated in FIG. 4, an electroconductive net 5 having a mesh size of 80 to 250 mesh is arranged preferentially in the vicinity of one surface 3.

Referring to FIG. 5 showing in an enlarged menner the section in the vicinity of the surface and FIG. 6 showing the state of the surface, fine uniform dents 12 corresponding to mesh openings between electroconductive net strands 10 are formed. The surfaces of the strands 10 are completely covered with the resin 2. Accordingly, the surface 3 of the molded resin body is protruded most outwardly at the positions of the net strands and sinks most deeply in the central portions between every two adjacent net strands. Accordingly, it will be understood that a uniform, fine and regular pattern of convexities and concavities is formed on the surface.

It is considered that for formation of a laminate structure of an electroconductive porous member and a transparent resin, there may be adopted a process in which the electroconductive porous member is interposed between two transparent resin plates and both the resin plates are integrated by heat pressing, ultrasonic wave welding or bonding using an adhesive. In this case, however, fine voids are inevitably left between the electroconductive member and the resin and complete integration is impossible. Accordingly, peeling is caused in the interface between the electroconductive member and the resin or distortion of the image is caused in the interface.

According to this embodiment of the present invention, the above defects are completely eliminated by using a radical-polymerizable resin syrup, embedding a metal-coated synthetic fiber gauze in this syrup and polymerizing the syrup to effect integration, and the shrinkage caused at the step of polymerizing and curing the resin syrup is utilized for formation of the above-mentioned fine dents.

Figure 7:
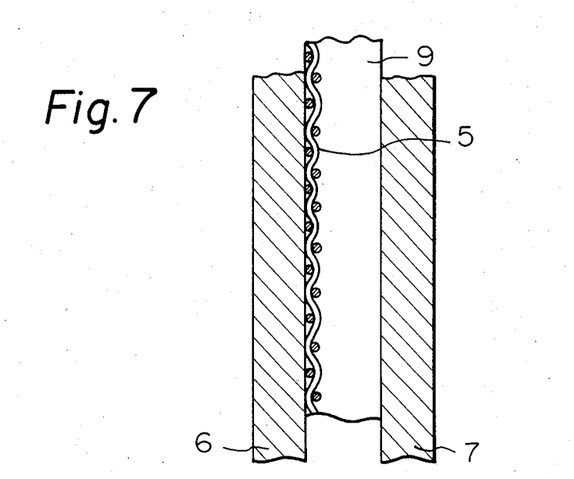
FIG. 7 is a diagram illustrating the production of the plate shown in FIG. 4.

The electromagnetic wave shielding material 1 of the present embodiment is prepared, as shown in FIG. 7, by arranging an electroconductive net 5 on one side of sheet-like molds 6 and 7 formed of a reinforced glass or the like through spacers or gaskets (not shown) capable of following the shrinkage caused at the polymerizing and curing step, casting the radical-polymerizable composition in the space between the molds 6 and 7 and polymerizing the composition.

When the radical-polymerizable syrup is polymerized and cured, the shrinkage of the volume is inevitably caused according to the state of the syrup. In the resin surface, in the vicinity of which the electroconductive net 5 is arranged, the shrinkage in the plane direction is controlled by the presence of the electroconductive net, and the shrinkage is caused in the thickness direction in the portions of openings of the net, with the result that fine convexities and concavities can be formed.

If the electroconductive net 5 is located so that the distance d from the mold surface is up to 0.8 mm, fine convexities and concavities sufficient for diffused reflection can be formed.

In this embodiment, the polymerization and curing conditions may be the same as those described above. However, it is preferable to adopt a process in which the resin composition is heat-polymerized in the mold, the molded body is taken out in the heated state from the mold and the molded body is cooled to form dents by shrinking only the portions of openings of the net.

According to this embodiment of the present invention, by embedding the electroconductive net in the vicinity of the resin surface, an excellent transparency and a high electromagnetic wave shielding effect can be obtained, and by uniformly forming dents in openings of the net, rays are diffusedly reflected and an excellent reflection preventing effect can be obtained, and the embodiment is advantageous in that these dents are formed in situ by the shrinkage of the resin at the polymerizing and molding step.

Moreover, since the resin and the net are completely integrated very closely and no voids are formed, no distortion is caused in the seen-through image.

Instead of the above-mentioned process in which the fiber gauze is located preferentially on the surface, there may be adopted a process in which, as shown in FIG. 2, the gauze 5 is located substantially in the central portion of the molds 6 and 7, a reinforced glass sheet having a flat surface is used as one mold 6 and a mold having fine convexities and concavities on the surface is used as the other mold 7, and these fine convexities and concavities are transferred to the surface of the molded body to impart a light scattering property to the surface. As the mold having fine convexities and concavities, there may be used an etched stainless steel plate and a glass sheet having the surface uniformly coarsened by hydrofluoric acid.

Various surface treatments may be conducted on the electromagnetic wave shielding material of the present invention. For example, a substance capable of absorbing near infrared rays may be coated on the surface.

Compounds represented by the following formula:

wherein X stands for a sulfur atom or an oxygen atom, Y stands for a quaternary ammonium group, and each of the rings A and B may be substituted by a halogen atom such as chlorine or may be fused to form a naphthalene ring or the like.

As specific examples, there can be mentioned bis(1,2,4-trichloro-5,6-dithiophenolato)nickel (II).tetra-n-butyl ammonium, bis(1,4-dichloro-5,6-dithiophenolato)nickel (II).tetra-n-butyl ammonium, bis(1,2,3,4-tetrachloro-5,6-dithiophenolato)nickel (II).-tetra-n-butyl ammonium and bis(1-thio-2-naphtholato)-nickel (II).tetra-n-butyl ammonium. Of course, near infrared ray absorbing substances that can be used in the present invention are not limited to those mentioned above.

In accordance with a preferred embodiment of the present invention, the near infrared ray absorbing substance is dissolved or dispersed in a solution of a transparent thermoplastic resin, and the solution is coated on at least one surface of the shielding material to form a coating layer having a near infrared ray absorbing capacity. As the resin in which the near infrared ray absorbing substance is dissolved or dispersed, in view of the optical trnasparency and the adhesion to the cured body of the polyol polyallyl carbonate, a cellulose ester type resin such as cellulose acetate butyrate or an acrylic resin such as polymethyl methacrylate is preferably used. The thickness of the coating layer is preferably 1 to 5 μm, and it is preferred that the near infrared ray absorbing substance is coated in an amount of 0.02 to 0.08 mg/dm$^2$.

The present invention will now be described in detail with reference to the following examples that by no means limit the scope of the invention.

EXAMPLE 1

An electromagnetic wave shielding plate was prepared by using molds shown in FIG. 2.

A 200-mesh polyester monofilament gauze was coated with copper so that clogging of mesh openings was not caused, and the gauze was blackened. A uniform tension was applied to the so-prepared electromagnetic wave shielding net. Then, gaskets were placed at the respective peripheral edge portions of two glass sheets having a 400-mm square shape, and the electromagnetic wave shielding net was interposed between the glass sheets and was clipped so that a clearance of 3 mm was formed.

Dissopropyl peroxydicarbonate was dissolved at a concentration of 3% by weight in monomeric diethylene glycol bisallyl carbonate, and the solution was cast from an injection hole formed in the upper portion of the gasket and heat curing was carried out under the following conditions to obtain an intended molded body:
- 45° C.—3 hours
- 50° C.—2 hours
- 55° C.—2 hours
- 60° C.—2 hours
- 65° C.—2 hours
- 70° C.—1 hour
- 75° C.—1 hour
- 80° C.—1 hour
- 90° C.—0.5 hour
- 100° C.—0.5 hour The obtained electromagnetic wave shielding plate had none of warps, bends and other deformations and was excellent in the transparency, and when the shielding plate was used as a filter, no eyesore was caused.

EXAMPLE 2

The following components were prepared:
(1) Diethylene glycol bisallyl carbonate—90% by weight
(2) Methyl methacrylate—7.2% by weight
(3) 2(2'-Hydroxy-5'-methylphenyl)benzotriazole—0.1% by weight
(4) Diisopropyl peroxydicarbonate—2.7% by weight The component (3) was dissolved in the component (2), and the solution was mixed with the components (1) and (4) to form a molding composition.

Figure 3:
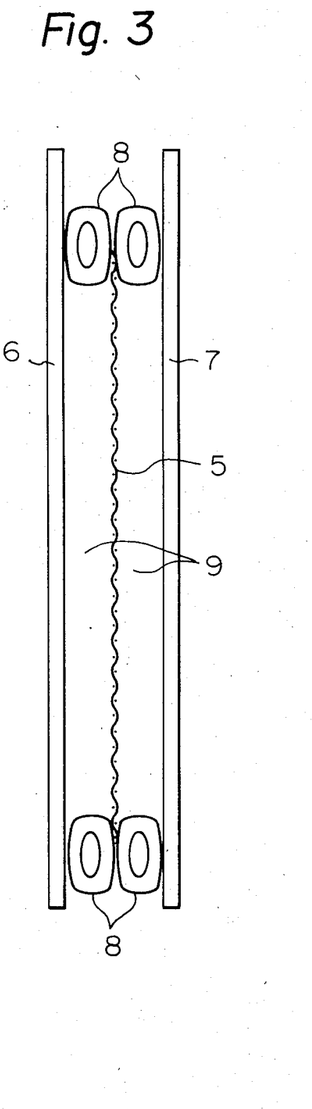
FIG. 3 is a diagram illustrating another embodiment of the production of an electromagnetic wave shielding material according to the present invention.

Referring to FIG. 3 of the accompanying drawings, a blackened electromagnetic wave shielding material 5 comprising a 135-mesh polyester fiber gauze and a black nickel plating layer formed thereon was secured and sealed in the central portion of two glass sheets 6 and 7 by means of a soft spacer member composed of a soft vinyl chloride resin tube 3, which could follow the shrinkage at the polymerizing and curing step.

The above-mentioned molding composition was cast in the space 9 between the glass sheets 6 and 7, and the composition was polymerized and cured under temperature conditions as described in Example 1 to obtain a sheet-like molded body having a thickness of 3 mm. The electroconductive net was located in the central portion of the molded body and the resin was completely integrated through mesh openings.

The visible ray transmittance was reduced by about 50% in the obtained molded body by filling of the net, but the transparency was sufficient and ultraviolet rays having a wavelength shorter than 400 nm were substantially completely cut.

Figure 8:
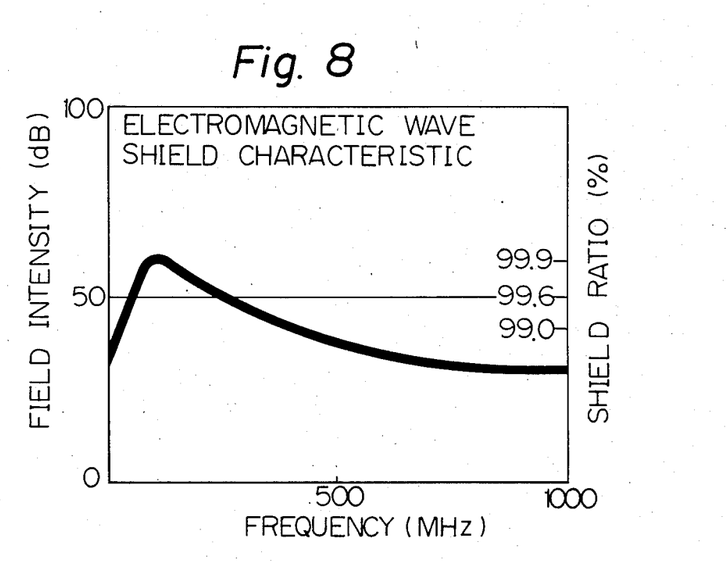
FIG. 8 is a graph showing the electromagnetic wave shielding characteristics of a shielding plate of the present invention (Example 4).
Figure 9:
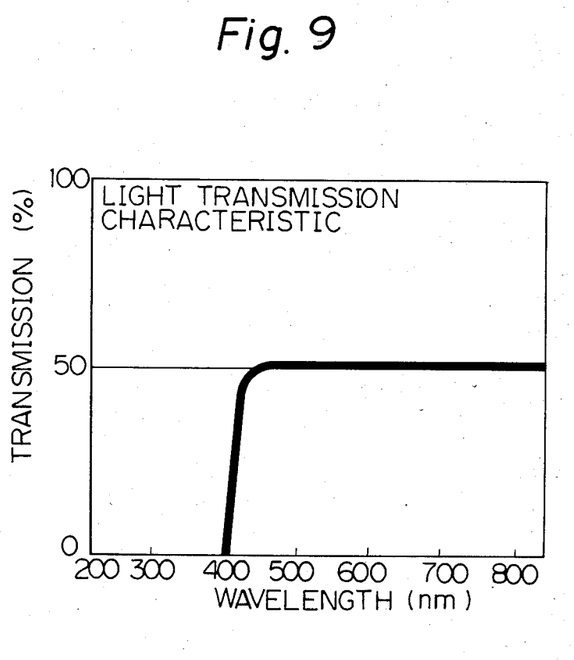
FIG. 9 is a graph showing the light transmittance of the shielding plate shown in FIG. 4.

The electromagnetic wave shielding characteristic and light transmittance of the so-obtained shielding plate were examined, and the obtained results are shown in FIGS. 8 and 9, respectively.

EXAMPLE 3

In a mixed solvent comprising 45 g of acetone and 40 g of toluene were dissolved 3 g of bis(1,2,4-trichloro-5,6-dithiophenolato)nickel (II) tetra-n-butyl ammonium and 12 g of polymethyl methacrylate, and the solution was coated in a dry thickness of 2 μm on one surface of the molded body obtained in Example 2 by a gravure coating machine and the coated molded body was dried to form a coating layer having a near infrared ray absorbing property.

EXAMPLE 4

The same resin composition and black electroconductive synthetic fiber gauze as used in Example 2 were used and molds shown in FIG. 7 were used. A uniform tension was applied to the gauze, and the gauze was inserted between two 400-mm square glass sheets having gaskets located in the peripheral portions so that the electromagnetic shielding net adhered closely to one glass sheet, and the net was clipped so that a clearance of 3 mm was formed.

The degasified casting composition was cast from a casting inlet formed in the upper portion of the gaskets and the composition was polymerized and cured at 80° C. for 3 hours. The obtained molded body was taken out while it was still hot, and it was cooled to room temperature.

The obtained electromagnetic wave shielding plate had fine convexities and concavities as shown in FIGS. 5 and 6 on the net-located side surface, and it was confirmed that the shielding plate had an excellent reflection-preventing effect.

I claim:

1. A transparent electromagnetic wave shielding material comprising a molded body of a synthetic resin composed mainly of diethylene glycol bisallyl carbonate and a blackened electroconductive fiber gauze embedded therein.

2. A shielding material as set forth in claim 1, wherein the electroconductive synthetic fiber gauze has openings having a mesh size of 80 to 250 mesh.

3. A shielding material as set forth in claim 1, wherein the electromagnetic synthetic fiber gauze is rendered electroconductive by forming a coating layer of copper or nickle on a synthetic fiber gauze.

4. A shielding material as set forth in claim 1, wherein the electroconductive synthetic fiber gauze has a black surface layer.

5. A shielding material as set forth in claim 1, wherein the synthetic fiber gauze is formed of a polyester fiber comprising polyethylene terephthalate units.

6. A shielding material as set forth in claim 1, wherein the molded synthetic resin body is composed of a cross-linked polymer comprising 60 to 100% by weight of diethylene glycol bisallyl carbonate and 0 to 40% by weight of a monofunctional, ethylenically unsaturated monomer.

7. A shielding material as set forth in claim 6, wherein the monofunctional, ethylenically unsaturated monomer is methyl methacrylate.

8. A shielding material as set forth in claim 1, wherein the electroconductive synthetic fiber gauze is embedded so that the gauze is predominantly arranged in the vicinity of the surface of the molded body and dents are formed on the resin surface in the mesh portions of the synthetic fiber gauze to impart a light scattering property to the surface of the molded body.

9. A shielding material as set forth in claim 1, wherein the electroconductive synthetic fiber gauze is preferentially located at a position apart from the surface of the shielding material with a distance of up to 0.8 mm.

10. A shielding material as set forth in claim 8, wherein a radical polymerizable composition comprising diethylene glycol bisallyl carbonate is cast in a mold containing the electroconductive synthetic fiber gauze located preferentially on one surface side, the composition is polymerized under heating, the formed molded body is taken out from the mold in the heated state and the molded body is cooled to shrink only the mesh opening portions and form dents.

11. A shielding material as set forth in claim 1, wherein the molded synthetic resin body contains a benzophenone or benzotriazole type ultraviolet absorber in an amount of 0.01 to 1% by weight based on the allyl carbonate and an acrylic or methacrylic monomer in an amount of 5 to 30% by weight based on the allyl carbonate.

* * * * *